US006995421B2

(12) United States Patent
Lee et al.

(10) Patent No.: US 6,995,421 B2
(45) Date of Patent: Feb. 7, 2006

(54) CELL STRUCTURE OF NON-VOLATILE MEMORY DEVICE AND METHOD FOR FABRICATING THE SAME

(75) Inventors: Tae-Jung Lee, Kyungki-do (KR); Byung-Sun Kim, Suwon (KR); Joon-Hyung Lee, Seongnam (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/621,571

(22) Filed: Jul. 18, 2003

(65) Prior Publication Data

US 2004/0135191 A1 Jul. 15, 2004

(30) Foreign Application Priority Data

Jan. 11, 2003 (KR) .................... 10-2003-001815

(51) Int. Cl.
*H01L 29/788* (2006.01)
(52) U.S. Cl. ...................... 257/315; 257/300
(58) Field of Classification Search ............. 257/315, 257/316
See application file for complete search history.

(56) References Cited

U.S. PATENT DOCUMENTS

| 5,422,504 | A  | * | 6/1995 | Chang et al. ......... 365/185.15 |
| 6,177,318 | B1 | * | 1/2001 | Ogura et al. ............. 438/267 |
| 6,774,431 | B2 | * | 8/2004 | Rudeck .................... 257/316 |
| 6,838,342 | B1 | * | 1/2005 | Ding ........................ 438/257 |
| 6,849,506 | B2 | * | 2/2005 | Na et al. .................. 438/264 |
| 2004/0152268 | A1 | * | 8/2004 | Chu et al. ................ 438/266 |

* cited by examiner

*Primary Examiner*—Thao P. Le
(74) *Attorney, Agent, or Firm*—Harness, Dickey & Pierce

(57) ABSTRACT

A cell structure of a non-volatile memory device, which uses a nitride layer as a floating gate spacer, includes a gate stack and a floating gate transistor formed over a semiconductor substrate. The gate stack includes a first portion of a floating gate, a control gate formed over the first portion of the floating gate, and a non-nitride spacer adjacent to sidewalls of the first portion of floating gate. The floating gate transistor includes a second portion of the floating gate, which substantially overlaps a source and/or drain formed in the substrate. The application of ultraviolet rays to the non-nitride spacer of a programmed cell can causes the second portion of the floating gate to discharge, thereby easily erasing the programmed cell.

16 Claims, 9 Drawing Sheets

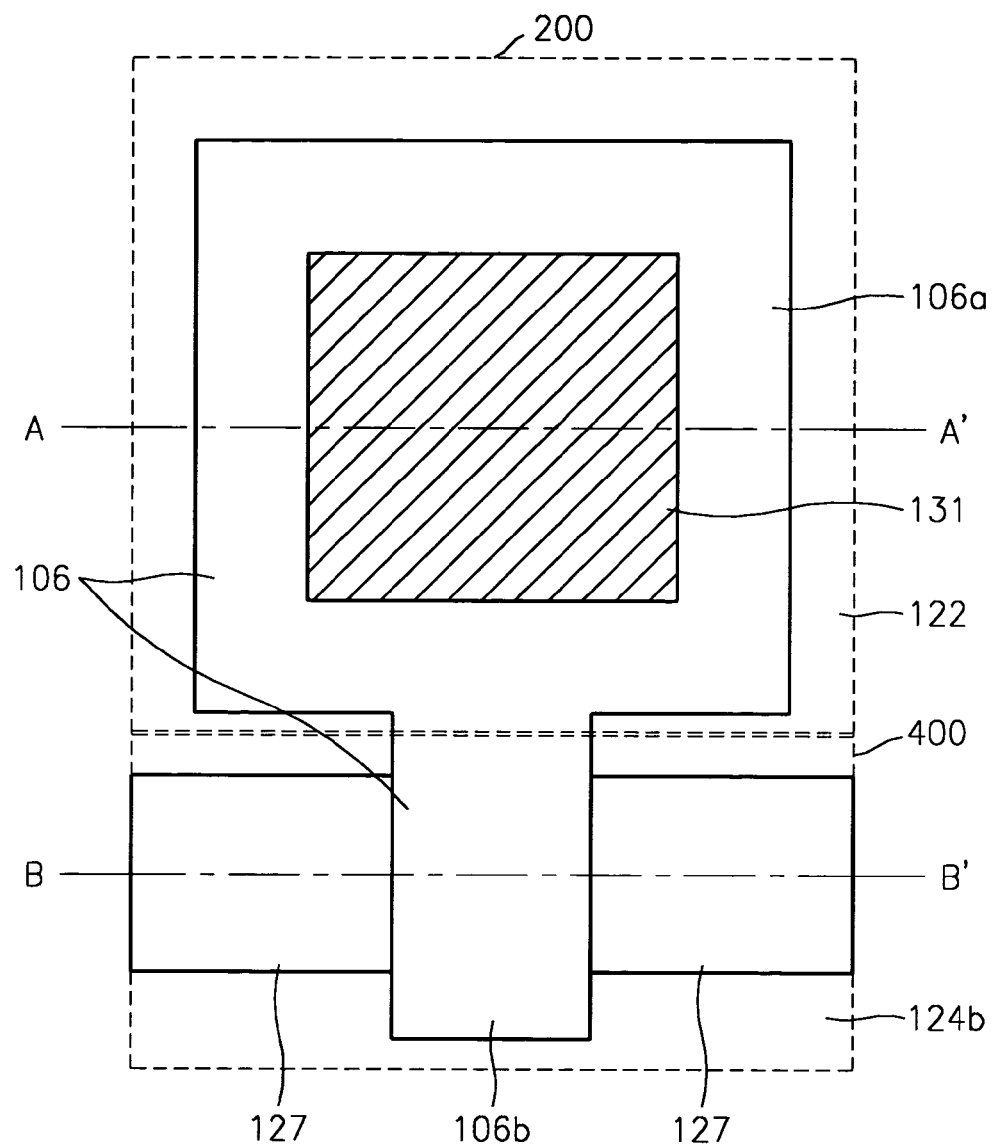

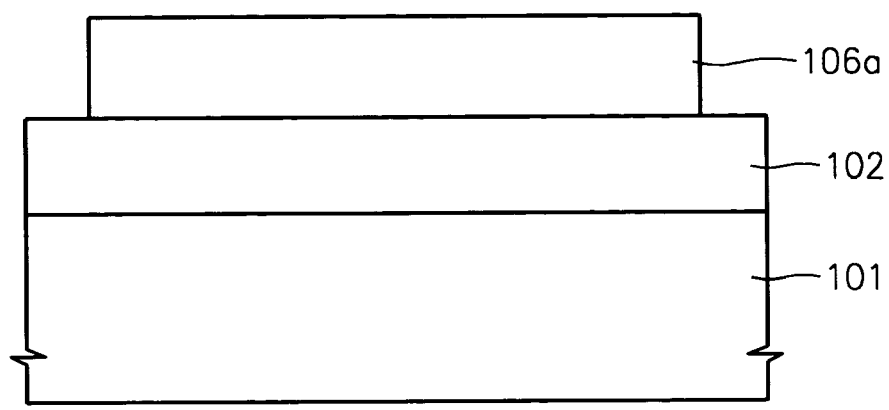
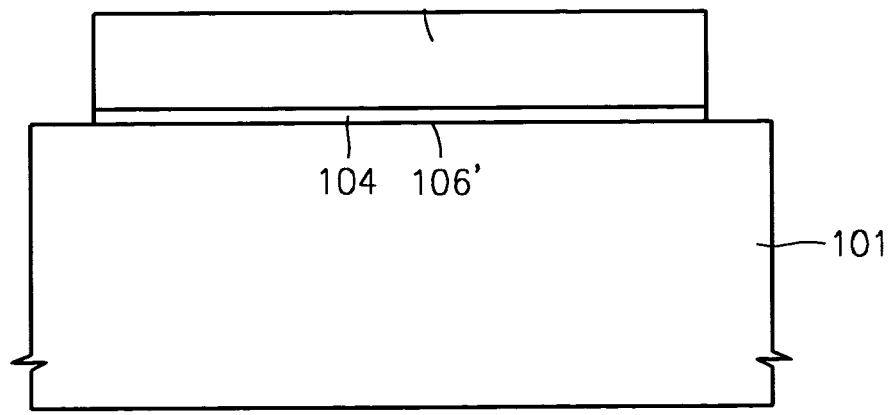

US 6,995,421 B2

CELL STRUCTURE OF NON-VOLATILE MEMORY DEVICE AND METHOD FOR FABRICATING THE SAME

This application claims the priority of Korean Patent Application No. 2003-01815 filed on Jan. 11, 2003, in the Korean Intellectual Property Office, the contents of which are incorporated herein by reference in its entirety.

BACKGROUND OF THE INVENTION

1. Field of the Invention

The present invention relates to a semiconductor memory device, and more particularly, to the cell structure of a nonvolatile memory device.

2. Description of the Related Art

Semiconductor memory devices can be classified into random access memories (RAMs) and read only memories (ROMs). When an interruption in power supply occurs, data stored in a RAM is erased, while a ROM maintains its stored data. For this reason, ROMs are classified as "nonvolatile memory devices." An erasable programmable read-only memory (EPROM) device is a particular type of nonvolatile memory devices, which is reusable by allowing its stored data to be erased. One variation of EPROM devices is a flash memory device, which allows data to be erased in blocks (two or more bytes) rather than one byte at a time.

Data stored in the EPROM device can be erased by applying ultraviolet rays to a window attached to the surface of a memory chip. Research is being conducted to develop system-on-chip (SOC) devices, which include EPROM devices along with various devices, such as logic circuits or drive circuits. The EPROM devices can be used while the SOC devices are being manufactured, for example, to calibrate disparity between devices or represent manufacturers' names on fabricated chips.

As the line widths of circuits have become finer, the fabrication processes of semiconductors increasingly use silicide layers, such as TiSix, CoSix, and NiSix, to reduce the resistances of gate lines and metal contacts. When a silicide layer is used, a nitride layer is applied as a gate spacer for the transistor, rather than an oxide layer. This improves the characteristics of the transistor by preventing a short between the gate and either the source or drain during the silicidation process.

When a cell of the EPROM device is formed by a process using a nitride layer as the gate spacer, an ONO (oxide-nitride-oxide) layer is formed on top of a floating gate, and a nitride spacer is formed on the sides of the floating gate. That is, the process forms nitride layers all around the floating gate. In such a case, it becomes difficult to erase charges of the floating gate by ultraviolet rays, since ultraviolet layers cannot pass through the nitride layers.

SUMMARY OF THE INVENTION

Exemplary embodiments of the present invention provide a cell structure for a non-volatile device using a nitride layer as a floating gate spacer, which allows charges of the floating gate to be erased by applying ultraviolet rays to an exposed non-nitride spacer.

Exemplary embodiments of the present invention also provide a method for fabricating the cell structure of the non-volatile memory device.

According to an exemplary embodiment, the cell structure of a non-volatile memory device comprises a gate stack, which includes a first portion of a floating gate formed over a semiconductor substrate, a control gate formed over the first portion of the floating gate, and a non-nitride spacer adjacent to sidewalls of the first portion of the floating gate. In an exemplary embodiment, the cell structure of the non-volatile memory device further comprises a floating gate transistor, which includes a second portion of the floating gate formed over the semiconductor substrate so that is substantially overlaps a portion of a source and/or drain implanted in the substrate.

According to an exemplary embodiment, the non-nitride spacer may be a double layer formed of a polysilicon spacer and an oxide spacer.

According to exemplary embodiments, the gate stack may include the nitride layer in an insulating pattern between the control gate and the first portion of the floating gate, and the floating gate transistor may include a nitride spacer adjacent to sidewalls of the second portion of the floating gate. A nitride spacer may also be adjacent to sidewalls of the control gate.

According to an exemplary embodiment, when a first voltage is applied to the control gate of the gate stack and a second voltage is applied to the second portion of the floating gate of the floating gate transistor, charges may be injected to the first portion of the floating gate from the source and/or the drain by hot carrier injection, thereby programming the cell. In a further exemplary embodiment, the charges can be discharged from the first portion of the floating gate to the source and/or drain by applying ultraviolet rays to the exposed non-nitride spacer of the gate stack, thereby erasing the programmed cell.

According to an exemplary embodiment of the present invention, the cell structure may be implemented in an EPROM device or a flash memory.

In accordance with an exemplary embodiment of the present invention, a method for fabricating a cell structure of a non-volatile memory device includes forming a floating gate over a semiconductor substrate, such that a first portion of the floating gate is formed over a gate stack region of the substrate and a second portion of the floating gate and a second portion of the floating gate is formed over a floating gate transistor region of the substrate; forming a control gate over at least a part of the first portion of the floating gate of the gate stack region; and forming a non-nitride spacer adjacent to sidewalls of the first portion of the floating gate. According to an exemplary embodiment, impurity ions may be implanted into the semiconductor substrate so as to implant a source and/or a drain at least partially in the floating gate transistor region, such that the floating gate substantially overlaps a portion of the implanted source and/or drain.

BRIEF DESCRIPTION OF THE DRAWINGS

Various features and advantages of the present invention will become readily apparent in view of the detailed description of exemplary embodiments set forth below with reference to the attached drawings, in which like reference numerals designate like structural elements, and, in which:

FIG. 1 illustrates a cell layout of a non-volatile memory device according to an exemplary embodiment of the present invention;

FIGS. 3A, 4A, 5A, 6A, 7A, 8A, and 9A illustrate various cross-sectional views of the gate stack during a fabrication process of a cell of the non-volatile memory device according to exemplary embodiments of the present invention; and FIGS. 3B, 4B, 5B, 6B, 7B, 8B, and 9B illustrate various cross-sectional views of the floating gate transistor during a fabrication process of a cell of the non-volatile memory device according to exemplary embodiments of the present invention.

DETAILED DESCRIPTION OF THE INVENTION

Figure 2A:
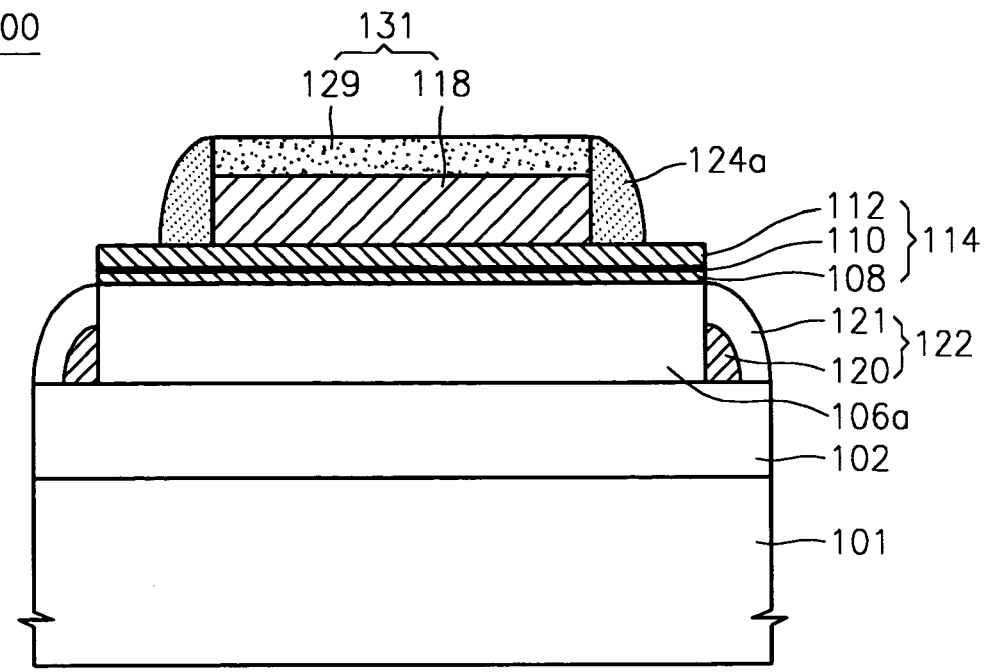
FIGS. 2A and 2B illustrate cross-sectional views taken along the line A–A' of a gate stack and the line B–B' of a floating gate transistor of FIG. 1, respectively, according to exemplary embodiments of the present invention.

The present invention and exemplary embodiments thereof are more fully described below with reference to the accompanying drawings. This invention may, however, be embodied in many different forms and should not be construed as being limited to the exemplary embodiments set forth herein. Rather, these exemplary embodiments are provided so that this disclosure is thorough and complete, and conveys the concept of the invention to those skilled in the art. In the drawings, the thicknesses of layers and regions are exaggerated for clarity. Further, it will be understood that when a layer is referred to as being "on" or "formed over" another layer or substrate, the layer may be directly on the other layer or substrate, or intervening layers may also be present.

FIG. 1 illustrates a cell layout of a non-volatile memory device according to an exemplary embodiment of the present invention.

Specifically, the cell of the non-volatile memory device according to an exemplary embodiment of the present invention includes a floating gate 106 formed over a semiconductor substrate (not shown). The floating gate 106 can be contemplated as comprising two portions, where a first portion 106a of the floating gate 106 is included in a gate stack 200 and a second portion 106b is included in a floating gate transistor 400 of the cell structure.

In an exemplary embodiment, the cell structure of the non-volatile memory device includes a gate stack 200 on a semiconductor substrate (not shown). The gate stack 200 may include the first portion of the floating gate 106a, an insulating pattern (not shown) formed over the first portion of the floating gate 106a, a control gate 131 formed over the insulating pattern, and a non-nitride spacer 122 surrounding the first portion of floating gate 106a.

The floating gate 106 (including the first portion 106a, as well as the second portion 106b) may be formed of a polysilicon doped with impurity ions. In an exemplary embodiment, the insulating pattern is formed at least partially of a nitride layer. For example, the insulating pattern may be formed of an oxide-nitride-oxide (ONO) layer or a nitride-oxide (NO) layer. The control gate 131 can be a double layer formed of a polysilicon doped with impurity ions and a suicide layer. According to an exemplary embodiment, the non-nitride spacer 122 can be a double layer formed of a polysilicon spacer and an oxide spacer.

According to an exemplary embodiment illustrated in FIG. 1, the cell of the non-volatile memory device further includes a floating gate transistor 400, in which a gate insulating layer (not shown) is formed over the semiconductor substrate, a second portion of the floating gate 106b is formed over the gate insulating layer, and a source and drain (collectively referred to as 127). The source and drain is implanted in the semiconductor substrate so as to be aligned with the second portion of the floating gate 106b. As shown in FIG. 1, a nitride spacer 124a surrounds the second floating gate 106b according to an exemplary embodiment.

In an exemplary embodiment, the source and drain 127 are aligned with the second portion of the floating gate 106b so that at least one sidewall of the second portion 106b perpendicularly overlaps a narrow portion of the source and drain 127. Like the first portion 106a, the second portion of the floating gate 106b may be formed of a polysilicon doped with impurity ions.

According to an exemplary embodiment of the present invention, the cell structure illustrated in FIG. 1 is operable as follows. When a particular voltage (i.e., first voltage level) is applied to the control gate 131 of the gate stack 200, and another voltage (i.e., second voltage level) is applied to the second portion of the floating gate 106b, charges are injected from the source and/or drain 127 into the first portion of the floating gate 106a by hot carrier injection. Thus, the cell is programmed. The voltages may be applied via metal contacts coupled to the control gate 131 and the second portion of the floating gate 106b.

The specific voltage levels to be applied to both the control gate 131 and the second portion of the floating gate 106b will be readily apparent and obvious to those of ordinary skill in the art.

According to another exemplary embodiment, however, a voltage may be applied directly to one, or both, of the source and drain 127 (e.g., via a metal contact) rather than the second portion of the floating gate 106b in order to program the cell. For instance, hot carrier injection can occur when a first voltage level is applied to the control gate 131 and a second voltage level is applied to the drain 127, while the source is grounded. According to an exemplary embodiment, the first voltage level applied to control gate 131 can be substantially within the range of 11–13 volts and the second voltage level applied to the drain 127 can be substantially within the range of 5–7 volts (while no voltage is applied to the source 127 or substrate. However, the present invention is not limited to such an embodiment, and covers any combination of applied voltage levels used for programming the cell, as will be readily apparent to those of ordinary skill in the art.

In an exemplary embodiment, ultraviolet rays can be applied to at least a portion of exposed surface area, or the entire exposed surface area, of the non-nitride spacer 122 in the gate stack 200 of a programmed cell, in order to discharge the charges from the first portion of the floating gate 106a to the source and/or drain 127. Thus, the programmed cell is erased.

In an exemplary embodiment, the cell structure explained above and illustrated in FIG. 1 may be implemented in an EPROM device, a flash memory device, or any other non-volatile memory device that uses a nitride layer as a spacer of a floating gate, as will be readily contemplated by those ordinarily skilled in the art.

Although FIG. 1 second portion of the floating gate 106b as being narrower than the first portion 106a, this is merely illustrative of one exemplary embodiment and does not limit the present invention.

For example, the surface areas of the first and second portion 106a and 106b may have the same width, and the source and drain 127 may be disposed further apart from one another, so that the second portion of the floating gate 106b overlaps only a narrow portion of the source and/or drain 127. Other obvious modifications of the configuration shown in FIG. 1, as will be contemplated by those of ordinary skill in the art, are covered by exemplary embodiments of the present invention.

Figure 2B:
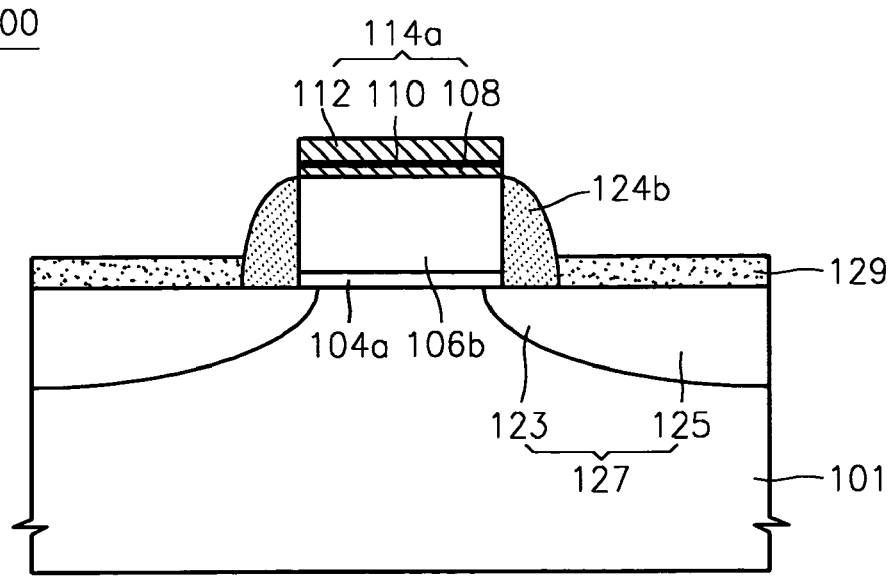

FIGS. 2A and 2B illustrate cross-sectional views taken along the line A–A' of the gate stack 200 and the line B–B' of the floating gate transistor 400 of FIG. 1, respectively, according to an exemplary embodiment of the present invention.

Referring to FIG. 2A, the gate stack 200 includes a field insulating layer 102 formed over the semiconductor substrate 101. In the gate stack, the first portion of the floating gate 106a, the insulating pattern 114, and the control gate 131 are sequentially formed over the field insulating layer 102. As described above, the first portion of the floating gate 106a can be formed of a polysilicon doped with impurity ions. The insulating pattern 114 can be formed of three different layers, including an oxide (O) layer 108, a nitride (N) layer 110, and another oxide (O) layer 112. In an alternative exemplary embodiment, the insulating pattern 114 may be formed of only two layers—a nitride layer 110 and an oxide layer 112.

As shown in FIG. 2A, the surface area of the first portion of the floating gate 106a can cover the same area as that of the insulating pattern 114. The control gate 131 can be formed of a polysilicon 118 doped with impurity ions and a silicide layer 129. According to an exemplary embodiment, the surface area of the control gate 131 does not cover the entire area of the first portion of the floating gate 106a. A nitride spacer 124a is formed adjacent to both sidewalls of the control gate 131. However, a non-nitride spacer 122 is formed adjacent to both sidewalls of the first portion of the floating gate 106a instead of a nitride spacer. The non-nitride spacer 122 may include both a polysilicon spacer 120 and an oxide spacer 121, as shown in FIG. 2A.

In exemplary embodiments of the present invention, all of, or at least a portion of, the surface area of the non-nitride spacer 122 is exposed. Thus, according to an exemplary embodiment, by applying ultraviolet rays over the entire gate stack 200, at least some of the ultraviolet rays will be applied to exposed portions of the non-nitride spacer 122, thus allowing charges to be discharged from the first portion of the floating gate 106a in a programmed cell.

Unlike a conventional cell structure of a non-volatile memory using a nitride spacer, the cell structure of the non-volatile memory device shown in FIG. 2A includes a non-nitride spacer 122 (e.g., the polysilicon spacer 120 and oxide spacer 121) adjacent to both sidewalls of the first floating gate 106a. Thus, ultraviolet rays can be applied through the non-nitride spacer 122 (e.g., through the oxide layer 121) to the cell structure of the non-volatile memory device and easily erase the programmed cell.

Referring to FIG. 2B, the floating gate transistor 400 may comprise a gate insulating pattern 104a, the second portion of the floating gate 106b, and an insulating pattern 114a formed of a nitride layer, all of which cover the same surface area on the semiconductor substrate 101. Similar to the insulating layer 114 of the gate stack 200 described above, the insulating pattern 114a may be formed of an oxide layer 108, a nitride layer 110, and an oxide layer 112. Alternatively, the insulating pattern 114a may be formed of only the nitride layer 110 and the oxide layer 112.

The source and drain 127 may be implanted in the semiconductor substrate 101 so as to be aligned with the sidewalls of the second portion of the floating gate 106b. Based on this alignment, at least one sidewall of the second portion of the floating gate 106b may perpendicularly overlap, by a narrow margin, either the source or drain 127. In a further exemplary embodiment, both sidewalls of the second portion of the floating gate 106b may perpendicularly overlap with a corresponding one of the source and drain 127.

According to exemplary embodiments, the source and/or drain 127 may be positioned in the semiconductor substrate 101 so as to be actually, or substantially, overlapped by the second portion of the floating gate 106b.

According to an exemplary embodiment, each of the source and drain 127 may include a lightly doped region 123 and a heavily doped region 125.

As shown in the exemplary embodiment of FIG. 2B, a nitride spacer 124b is formed adjacent to both sidewalls of the second floating gate 106b. However, in exemplary embodiments where the second portion of the floating gate 106b only overlaps one of the source and drain 127, the nitride spacer 124b may only be adjacent to the particular sidewall overlapping the source/drain 127.

Thus, unlike the conventional cell structure, the non-volatile memory device cell structure according to exemplary embodiments, as shown in FIG. 2B, the nitride spacer 124b can prevent a short between the second portion of the floating gate 106b and the source and/or drain 127 during a silicidation process for forming the silicide layer 129 over the source and drain 127. Thus, the characteristics of the floating gate transistor 400 can be improved.

FIGS. 3A, 4A, 5A, 6A, 7A, 8A, and 9A illustrate various cross-sectional views illustrating the gate stack 200 during a fabrication process of a cell of a non-volatile memory device, according to exemplary embodiments of the present invention. FIGS. 3B, 4B, 5B, 6B, 7B, 8B, and 9B illustrate cross-sectional views of the floating gate transistor 400 during a fabrication process of a cell of a non-volatile memory device according to exemplary embodiments of the present invention.

Figure 3A:
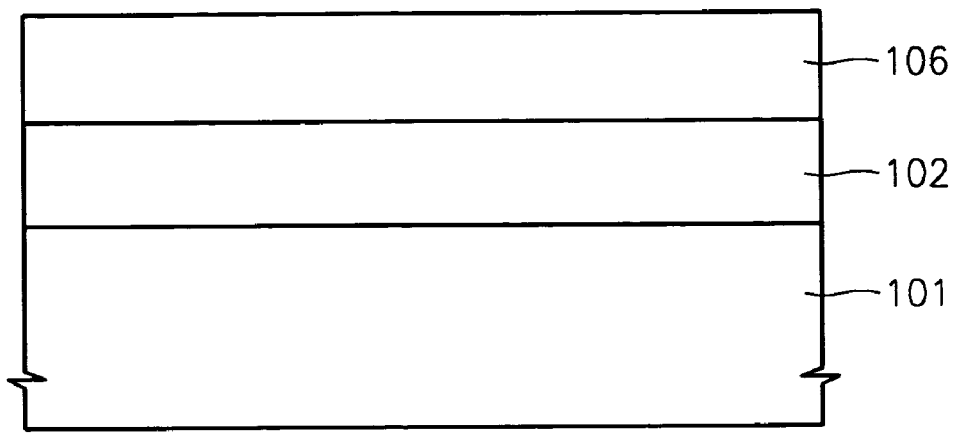
Figure 3B:
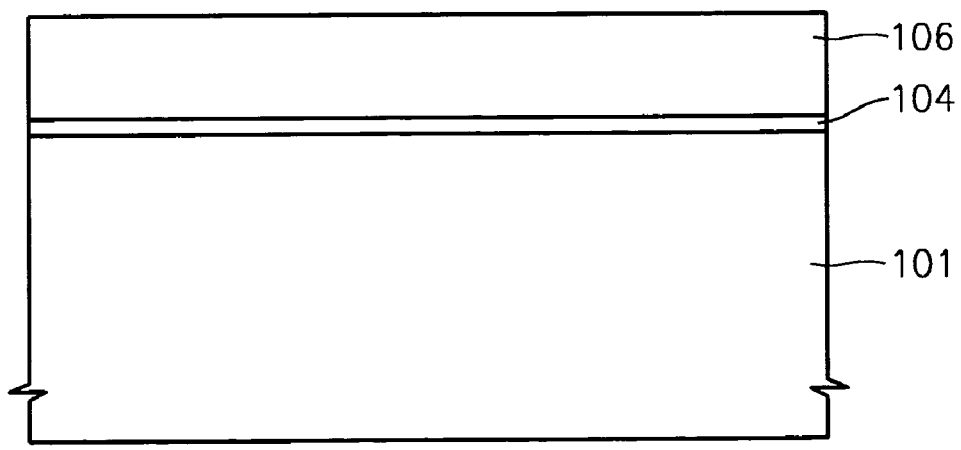

Referring to FIGS. 3A and 3B, a region of the gate stack 200 and a region of the floating gate transistor 400 can be defined on a semiconductor substrate 101, for example, a silicon substrate. A field insulating layer 102 can be formed over the semiconductor substrate 101. A region of the cell over which the field insulating layer 102 is formed can be referred to as an "isolation region," while a region of the cell over which the field insulating layer 102 is not formed can be referred to as an "active region."

As shown in FIG. 3B, a gate insulating layer 104 can be formed over the floating gate transistor region of the semiconductor substrate 101. According to an exemplary embodiment, the gate insulating layer 104 can be formed of an oxide layer with a thickness of 100 to 200 Å.

As shown in FIGS. 3A and 3B, a polysilicon layer doped with impurity ions can be formed over the field insulating layer 102 of the gate stack region and the gate insulating layer 104 of the floating gate transistor region so as to form the floating gate 106. The first polysilicon layer of the floating gate 106 is formed to a thickness of 1000 to 1500 Å.

Referring to FIGS. 4A and 4B, the polysilicon layer forming the floating gate 106 can be patterned, or etched, to be narrowed to a particular width across the gate stack and floating gate transistor regions. According to an exemplary embodiment, this step patterns the polysilicon layer to an appropriate width for the first portion of the floating gate 106a of the gate stack region (as shown in FIG. 4A).

On the other hand, this width may not be an appropriate final width for the second portion of the floating gate 106b. Thus, as shown in FIG. 4B, the portion of the etched polysilicon layer can be referred to as an intermediary polysilicon pattern 106' on the floating gate transistor region. According to an exemplary embodiment, the intermediary polysilicon pattern 106' can be etched down to an appropriate width to form the second portion floating gate 106b in subsequent patterning steps of the fabrication process (as illustrated in FIG. 7B).

During the step where the polysilicon layer is etched into the first portion of the floating gate 106a and the intermediary polysilicon pattern 106', the respective field insulating layer 102 and gate insulating layer 104 may also be etched. As a result, the first portion of the floating gate 106a and the intermediary polysilicon pattern 106' may cover the same surface area of the semiconductor substrate 101 as that covered by the field insulating layer 102 and gate insulating layer 104, respectively.

Figure 5A:
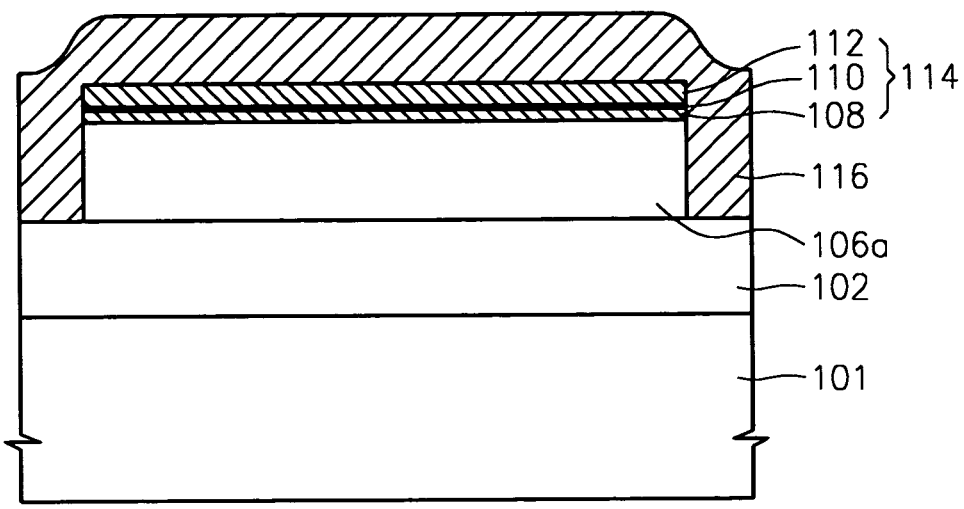
Figure 5B:
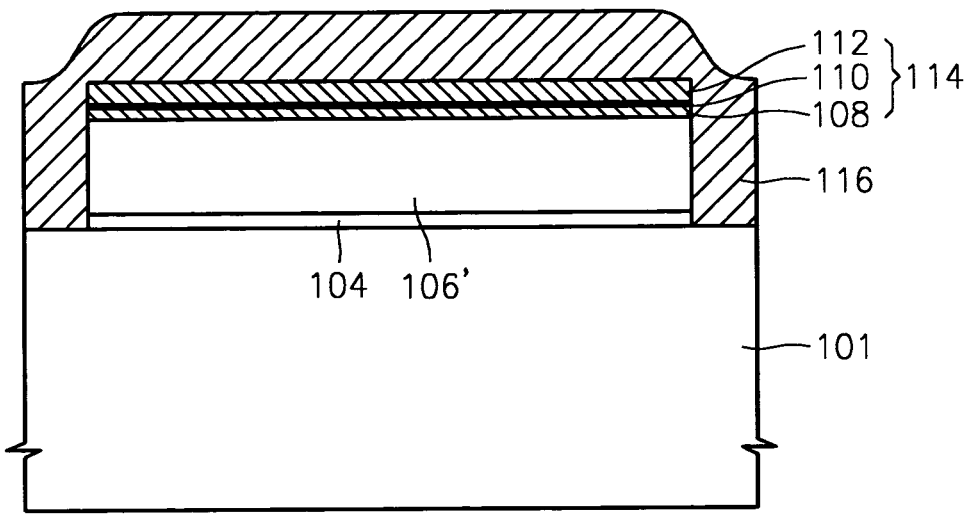

Referring to FIGS. 5A and 5B, an insulating pattern 114 can be formed over the first portion of the floating gate 106a and the polysilicon pattern 106'. This insulating pattern 114 can be formed of an oxide layer 108, a nitride layer 110, and another oxide layer 112. According to an exemplary embodiment, the oxide layer 108, nitride layer 110, and oxide layer 112 can be formed substantially to thicknesses of 100 Å, 200 Å, and 100 Å, over the surface areas of the first portion of the floating gate 106a and the intermediary polysilicon pattern 106'.

In an alternative embodiment, the step corresponding to FIGS. 5A and 5B forming the insulating pattern 114 to include only a nitride layer 110 and an oxide layer 112.

Further referring to FIGS. 5A and 5B, another polysilicon layer 116 doped with impurity ions may be formed over the entire gate stack region the entire surfaces of the gate stack and floating gate transistor regions of semiconductor substrate 101, after the insulating pattern 114 is formed.

Figure 6A:
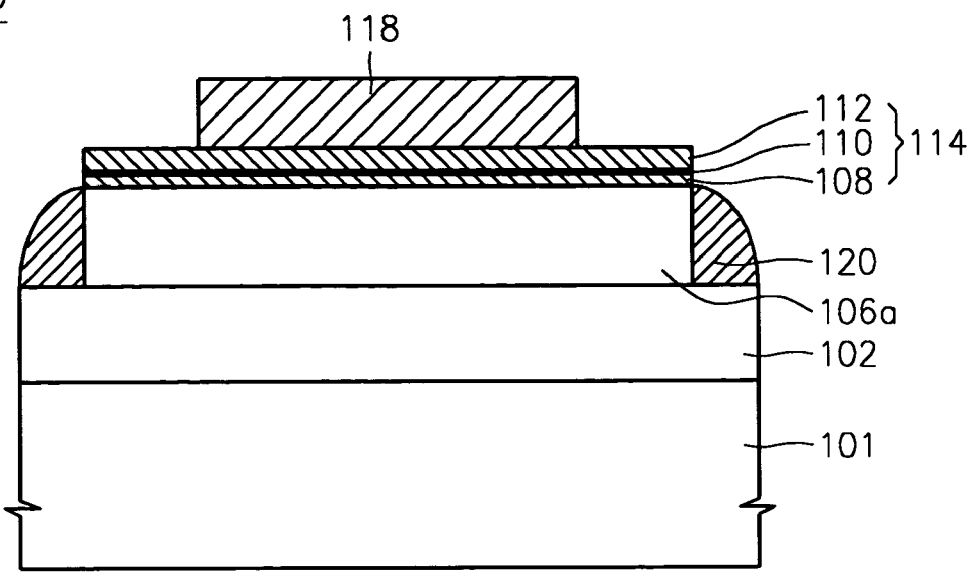
Figure 6B:
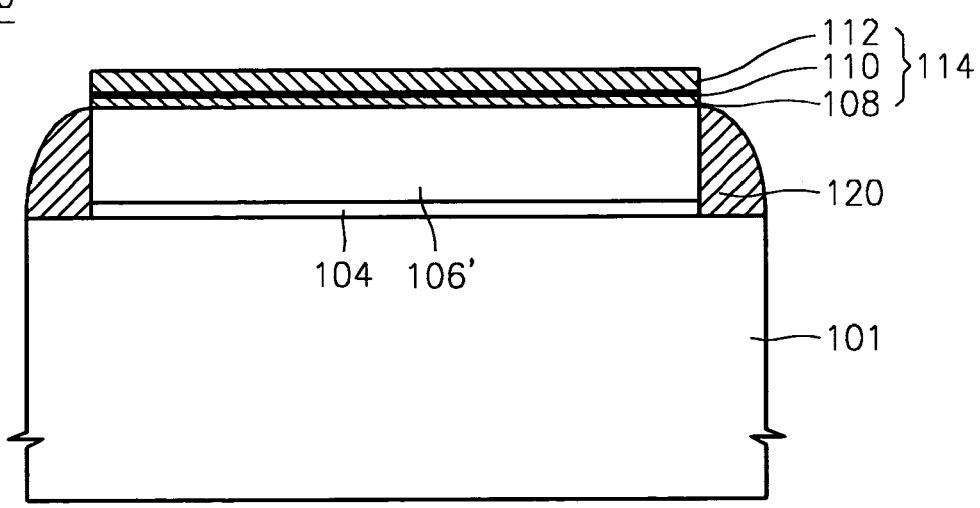

Referring to FIGS. 6A and 6B, the polysilicon layer 116 is patterned, or etched, to form a polysilicon pattern 118 over the insulating pattern 114 of the gate stack region. The polysilicon pattern 118 on the insulating pattern 114 a layer of the control gate to be formed over the gate stack region.

Also, as shown in FIGS. 6A and 6B, the polysilicon layer 116 can be patterned to form a polysilicon spacer 120 adjacent to both sidewalls of the first portion of the floating gate 106a and the intermediary polysilicon pattern 106' of the floating gate transistor region. Thus, the formed polysilicon spacer 120 that is adjacent to the sidewalls of the first portion of the floating gate 106a on the gate stack region can be made part of a non-nitride spacer 122 for the gate stack of the cell.

According to an exemplary embodiment, the polysilicon layer 116 may be etched such that there is no polysilicon pattern 118 formed on the first insulating pattern 114 of the floating gate transistor, as shown in FIG. 6B.

Referring to FIG. 7B, the insulating pattern 114, the intermediary polysilicon pattern 106', and the gate insulating layer 104 may be patterned, e.g., using photolithographic and etching processes, to form the insulating pattern 114a, second portion of the floating gate 106b, and gate insulating pattern 104a, respectively, of a floating gate transistor 400. Also, as shown in FIG. 7B, the polysilicon spacer 120 formed on the both sidewalls of the first polysilicon pattern 106' of the floating gate transistor can be removed.

Figure 7A:
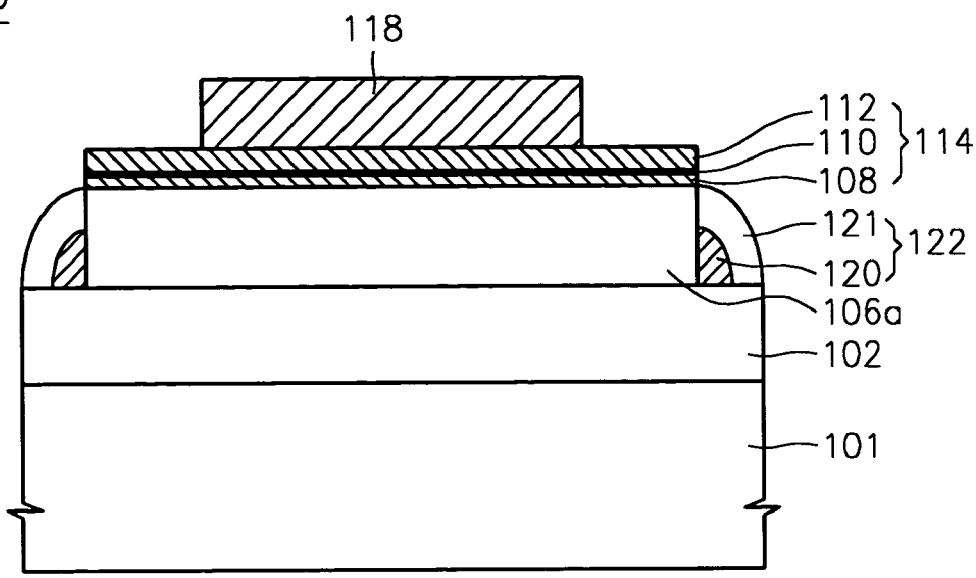
Figure 7B:
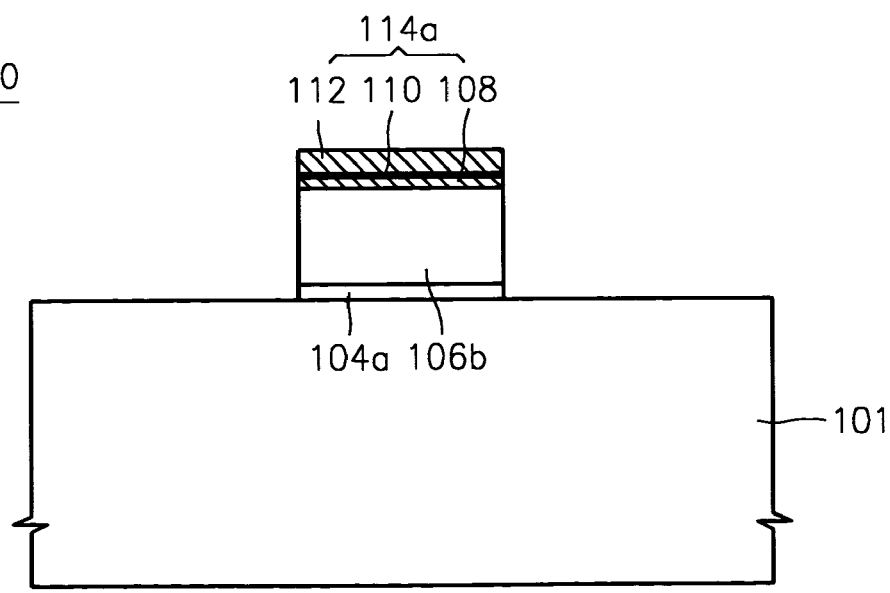

As shown in FIG. 7A, an oxide spacer 121 may be formed over the polysilicon spacer 120 of the gate stack region to thereby form a non-nitride spacer 122. According to an exemplary embodiment, the oxide spacer 121 can be obtained by oxidizing the polysilicon spacer 120.

In addition, an oxidation process of the second portion of the floating gate 106b can also be carried out in order to prevent etching damage during the etching process that forms the second floating gate 106b, and to improve characteristics of the floating gate transistor 400 by thickening the oxide layer disposed under the sides of the transistor 400.

Figure 8A:
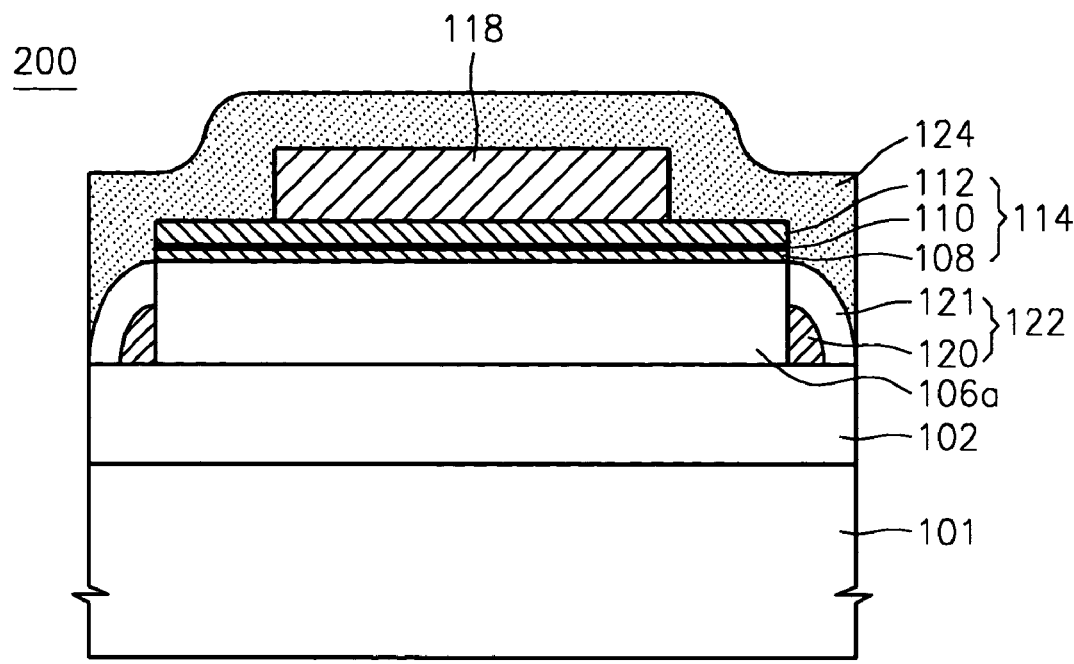
Figure 8B:
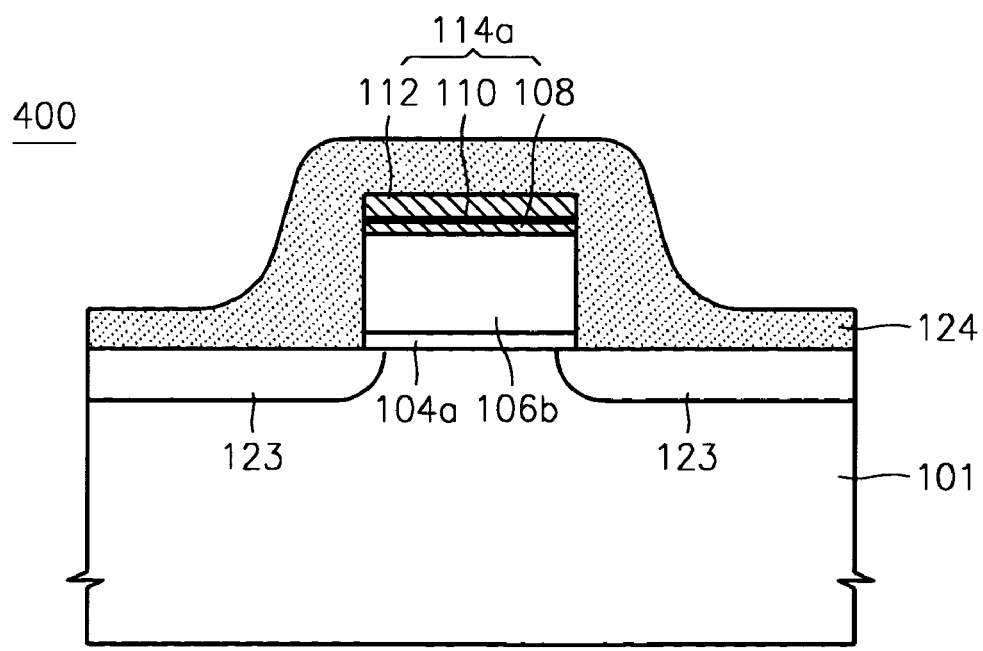

Referring to FIGS. 8A and 8B, impurity ions can be implanted into the semiconductor substrate 101 to be aligned with the sidewalls of the second portion of the floating gate 106b, thereby forming the lightly-doped regions 123 corresponding to a source and drain, as shown in FIG. 8B. As described above, the implantation of these lightly doped regions 123 should be such that a small portion of the source and/or the drain is overlapped by a sidewall of the second portion of the floating gate.

Also, as shown in FIGS. 8A and 8B, a nitride layer 124 may be formed over the entire surface of the gate stack and floating transistor regions of the semiconductor substrate 101.

Figure 9A:
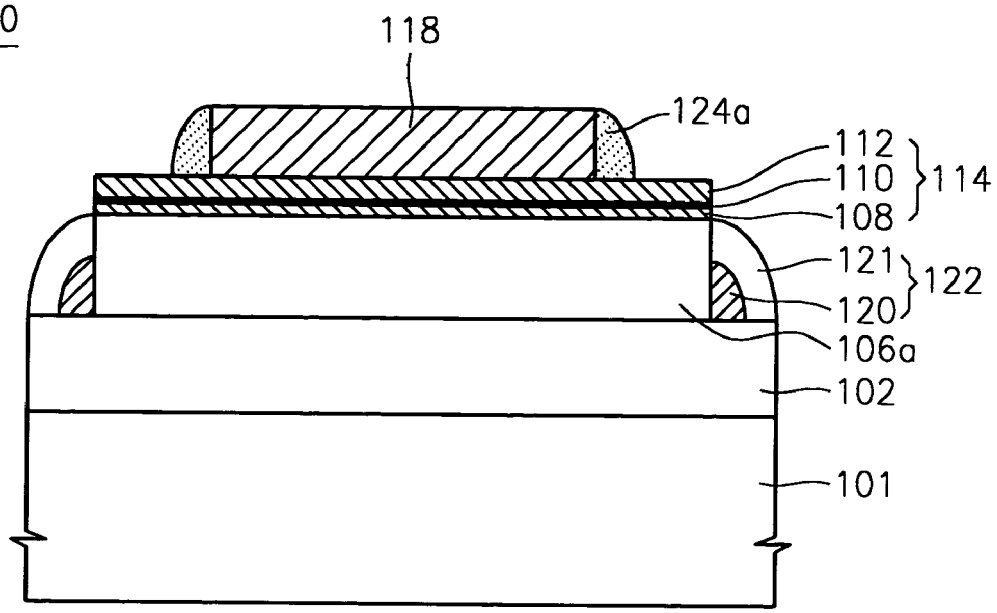
Figure 9B:
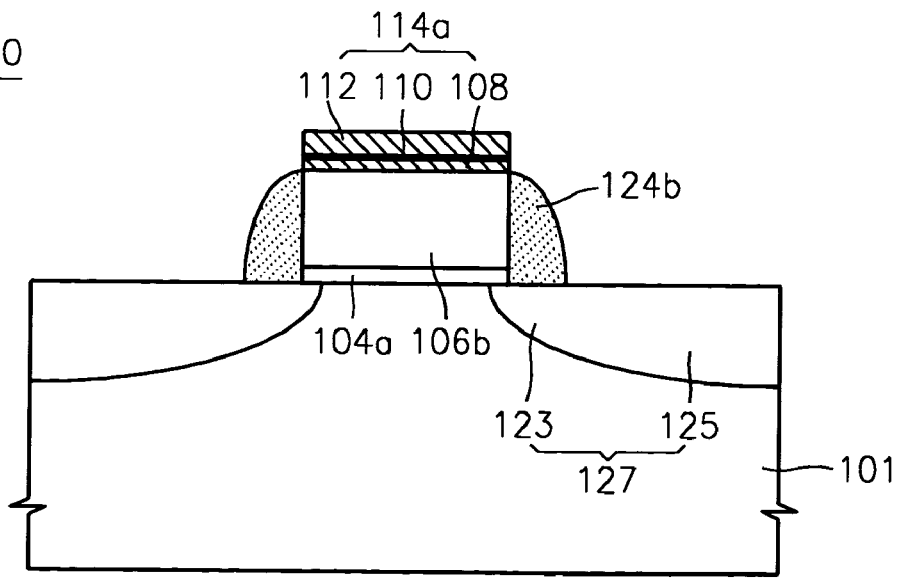

Referring to FIGS. 9A and 9B, the nitride layer 124 can be etched using an anisotropic etching process so as to form the nitride spacer 124a adjacent to both sidewalls of the polysilicon pattern 118 of the gate stack region. Also, the nitride layer 124 can be etched to form the nitride spacer 124b adjacent to both the sidewalls of the second portion of the floating gate 106b of the floating gate transistor region.

As illustrated in FIG. 9B, impurity ions can be implanted into the semiconductor substrate 101 so as to be aligned with the formed nitride spacer 124b, thereby forming the heavily doped regions 125 of a source and drain. As a result, the source and the drain 127, each of which includes a lightly doped region 123 and a heavily doped region 125, is formed in the semiconductor substrate 101.

As shown in FIGS. 2A and 2B, a silicide layer 129 can be formed over the polysilicon pattern 118 and the source/drain 127 in an exemplary embodiment. The silicide layer can help reduce the resistance to any voltages subsequently applied to these areas via a metal contact. According to this exemplary embodiment, a control gate 131 is formed, which includes not only the polysilicon pattern 118, but also the silicide layer 129.

By forming a non-nitride spacer 122, rather than a nitride spacer, adjacent to the sidewalls of the first portion of the floating gate 106a, exemplary embodiments of the present invention allow a programmed cell in a non-volatile memory device to be easily erased by applying ultraviolet rays to the non-nitride spacer 122.

Furthermore, by forming the nitride spacer 124b adjacent to the sidewalls of a second portion of the floating gate 106b, exemplary embodiments help prevent shorts from occurring between the second portion of the floating gate 106b and a source/drain 127.

While the present invention has been particularly shown and described with reference to the exemplary embodiments described above, it will be understood by those of ordinary skill in the art that various changes in form and details may be made therein without departing from the spirit and scope of the present invention as defined by the following claims.

What is claimed is:

1. A cell structure of non-volatile memory device using a nitride layer as a floating gate spacer comprising:
   a gate stack including,
      a first portion of a floating gate formed over a semiconductor substrate,
      a control gate formed over at least part of the first portion of the floating gate, and
      an exposed non-nitride spacer adjacent to sidewalls of the first portion of the floating gate; and
   a floating gate transistor including,
      a second portion of the floating gate formed over the semiconductor substrate to substantially overlap a portion of at least one of a source and drain implanted in the semiconductor substrate.

2. The cell structure of claim 1, wherein the gate stack further includes,
an insulating pattern including a nitride layer between the control gate and the first portion of the floating gate.

3. The cell structure of claim 1, wherein the floating gate transistor further includes,
a nitride spacer adjacent to sidewalls of the second portion of the floating gate.

4. The cell structure of claim 1, wherein the non-nitride spacer includes a polysilicon layer and an oxide layer.

5. The cell structure of claim 1, further comprising:
a nitride spacer adjacent to sidewalls of the control gate.

6. The cell structure of claim 1, wherein the first and second portions of the floating gate comprise a polysilicon doped with impurity ions.

7. The cell structure of claim 1, further comprising:
an insulating pattern of the gate stack formed between the second portion of the floating gate and the semiconductor substrate, the insulating pattern including at least one of an oxide-nitride-oxide (ONO) layer and a nitride-oxide (NO) layer.

8. The structure of claim 1, wherein the control gate includes a polysilicon layer doped with impurity ions and a silicide layer, and a silicide layer is formed on the source and drain.

9. The cell structure of claim 1, wherein the non-volatile memory device is at least one of an erasable programmable read-only memory device (EPROM) and a flash memory device.

10. The cell structure of claim 1, wherein the at least one of an implanted source and drain is operable to inject charges into the first portion of the floating gate in response to a first voltage being applied to the control gate and a second voltage being applied to the second portion of the floating gate, thereby programming a corresponding cell of the non-volatile memory device.

11. The cell structure of claim 8, wherein the first portion of the floating gate is operable to discharge the injected charges to the at least one of an implanted source and drain in response to ultraviolet rays being applied to the exposed non-nitride spacer of the gate stack, thereby erasing the programmed cell.

12. A non-volatile memory including:
a floating gate formed over a semiconductor substrate;
a non-nitride spacer adjacent to a first portion of the floating gate; and
a nitride spacer adjacent to a second portion of the floating gate, the second portion substantially overlapping at least one of a source and drain in the semiconductor substrate.

13. The non-volatile memory of claim 12, further comprising:
a control gate formed over the first portion of the floating gate.

14. The non-volatile memory of claim 13, wherein the at least one of the source and drain is operable to inject charges into the floating gate via hot carrier injection, thereby programming a cell in the non-volatile memory.

15. The non-volatile memory of claim 14, wherein
the control gate is operable to receive a first voltage;
at least one of the source, drain, and second portion of the floating gate is operable to receive a second voltage; and
the receiving of the first and second voltages causes the at least one of the source and drain to inject the charges via hot carrier injection.

16. The non-volatile memory of claim 12, wherein the first portion of the floating gate is operable to discharge charges in response to ultraviolet rays being applied to at least a portion of the non-nitride spacer, thereby erasing a programmed cell in the non-volatile memory.

\* \* \* \* \*